(12) United States Patent
Borthakur

(10) Patent No.: US 10,638,063 B2
(45) Date of Patent: Apr. 28, 2020

(54) METHODS AND APPARATUS FOR INCREASED DYNAMIC RANGE OF AN IMAGE SENSOR

(71) Applicant: SEMICONDUCTOR COMPONENTS INDUSTRIES, LLC, Phoenix, AZ (US)

(72) Inventor: Swarnal Borthakur, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 134 days.

(21) Appl. No.: 16/032,957

(22) Filed: Jul. 11, 2018

(65) Prior Publication Data

US 2020/0021754 A1 Jan. 16, 2020

(51) Int. Cl.

| H01L 21/00 | (2006.01) |
|---|---|
| H04N 5/355 | (2011.01) |
| H04N 5/235 | (2006.01) |
| H04N 9/04 | (2006.01) |
| H01L 33/42 | (2010.01) |
| H01L 33/20 | (2010.01) |
| H01L 27/146 | (2006.01) |

(52) U.S. Cl.
CPC ......... H04N 5/355 (2013.01); H01L 27/1463 (2013.01); H01L 33/20 (2013.01); H01L 33/42 (2013.01); H04N 5/2355 (2013.01); H04N 9/0455 (2018.08)

(58) Field of Classification Search
USPC ..................... 438/57, 60; 257/432
See application file for complete search history.

(56) References Cited

U.S. PATENT DOCUMENTS

| 2012/0205730 A1 | 8/2012 | Chen | |
|---|---|---|---|
| 2013/0285181 A1* | 10/2013 | Lin | H01L 27/1463 257/432 |
| 2015/0340391 A1 | 11/2015 | Webster | |
| 2016/0204150 A1* | 7/2016 | Oh | H01L 27/14623 257/229 |
| 2017/0047363 A1* | 2/2017 | Choi | H01L 27/14605 |
| 2017/0062496 A1 | 3/2017 | Lai et al. | |

OTHER PUBLICATIONS

=Rederic Lalanne, et al., A native HDR 115dB 3.2um BSI pixel using electron and hole collection, International Image Sensor Society Workshop, 2017, pp. 278-281, IISS, Hiroshima, Japan.

* cited by examiner

*Primary Examiner* — Brook Kebede
(74) *Attorney, Agent, or Firm* — The Noblitt Group, PLLC

(57) ABSTRACT

Various embodiments of the present technology may comprise methods and apparatus for increasing dynamic range of an image sensor. According to an exemplary embodiment, the image sensor comprises a backside-illuminated hybrid bonded stacked chip image senor having a pixel circuit array. A capacitor is formed on each pixel circuit along two adjacent sidewalls of an epitaxial substrate layer facing a deep trench isolation region. The capacitor may also extend along an upper surface of the epitaxial substrate layer.

20 Claims, 9 Drawing Sheets

METHODS AND APPARATUS FOR INCREASED DYNAMIC RANGE OF AN IMAGE SENSOR

BACKGROUND OF THE TECHNOLOGY

Electronic devices, such as cellular telephones, cameras, and computers, commonly use image sensors to capture images by sensing light. A typical imager sensor includes a focal plane array of pixels, and each pixel includes a photosensor, such as a photogate, photoconductor, or photodiode, for accumulating photo-generated charge in a portion of the substrate. When photons impinge on the photosensor, electron-hole pairs are generated. Conventional image sensors convert the electrons that are integrated (collected) in the pixels into a voltage, and the holes are generally discarded into the substrate.

Typical CMOS image sensors have scene capture ranges within a range of 40-60 dB. This range is less than a human eye intra-scene capture range. A solution to this problem is high dynamic range (HDR) scene luminance that has a capture range of about 60-120 dB.

Current efforts to provide HDR scene luminance include intra-frame multi-exposure and interlaced exposures and have met with varying degrees of success. For example, several methods being used to provide HDR suffer from high memory requirements resulting from the need to store additional exposures, high power requirements, loss in resolution, and motion artifacts.

BRIEF DESCRIPTION OF THE DRAWINGS

A more complete understanding of the present technology may be derived by referring to the detailed description when considered in connection with the following illustrative figures. In the following figures, same reference numbers refer to similar elements and steps throughout the figures.

DETAILED DESCRIPTION OF EXEMPLARY EMBODIMENTS

Figure 1:
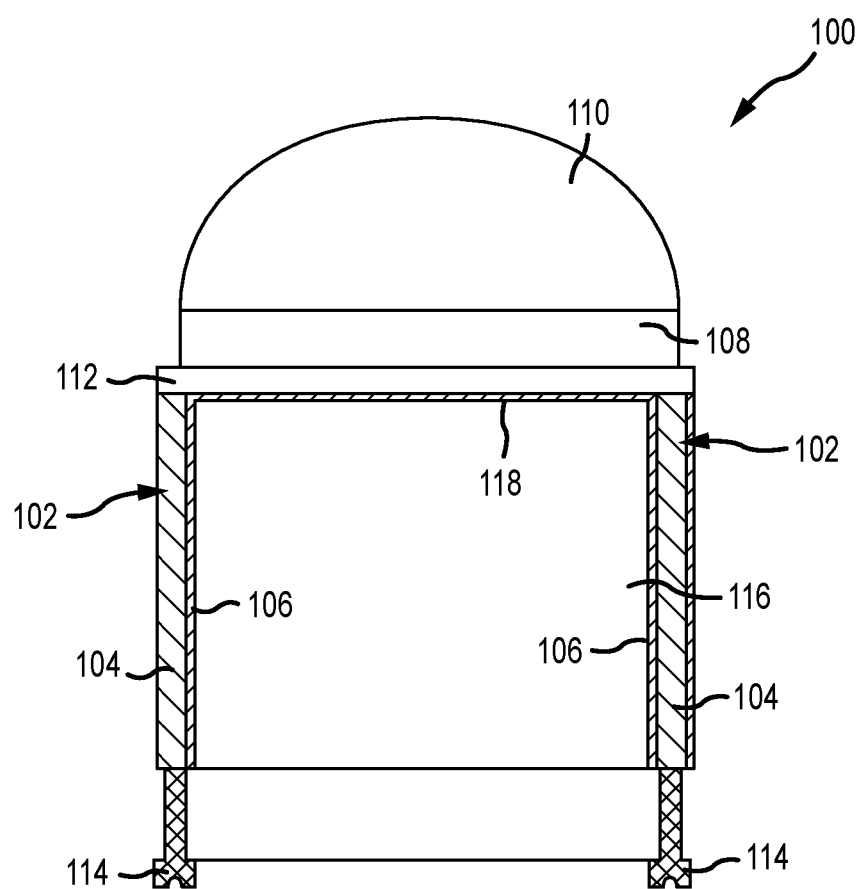
FIG. 1 representatively illustrates a cross-sectional view of a photodiode having a capacitor extending over two sidewalls of the photodiode in accordance with the present technology.

The present technology may be described in terms of functional block components and various signal processing steps. Such functional blocks may be realized by any number of components configured to perform the specified functions and achieve the various results. For example, the present technology may employ various semiconductor devices, transistors, capacitors, and the like, which may carry out a variety of functions. In addition, the present technology may be practiced in conjunction with any number of systems, such as portable devices, consumer electronics, automotive systems, surveillance systems, and the like, and the system described is merely one exemplary application for the technology. Further, the present technology may employ any suitable pixel architecture, readout scheme, and/or device layout.

Methods and apparatus for increasing dynamic range of an image sensor according to various aspects of the present technology may provide improved pixel capacitance to allow for greater luminance range sensing. The methods and apparatus for increasing high dynamic range for an image sensor according to various aspects of the present technology may operate in conjunction with any suitable image capture system, such as a digital camera, a cellular telephone, a tablet computer, a web camera, a video camera, a video surveillance system, an automotive imaging system, a video gaming system with imaging capabilities, or any other desired imaging system. Further, the disclosed technology for the image sensor may be utilized with any suitable imaging system, such as a camera system, video system, machine vision, vehicle navigation, surveillance system, motion detection system, and the like.

An exemplary imaging system may comprise an electronic device, such as a digital camera or digital video camera, configured to capture image data. For example, the imaging system may comprise a central processing unit (CPU) that communicates with various devices over a bus. Some of the devices connected to the bus may provide communication into and out of the system, for example an input/output (I/O) device.

The imaging system may be configured to construct a digital high dynamic range (HDR) image using both low light level signals and high light level signals from a single exposure. The imaging system may further comprise or be coupled to a display screen for viewing the HDR image. The display screen may be coupled to and configured to send and/or receive information, such as image data, from the bus.

The imaging system comprises an image sensor for capturing and conveying image data. For example, the image sensor may comprise an array of pixel circuits to detect the light and convey information that constitutes an image by converting the variable attenuation of photon flow (as they pass through or reflect off object) into electrical signals. The image sensor may be implemented in conjunction with any appropriate technology, such as active pixel sensors in CMOS technology.

In various embodiments, the imaging system may comprise a primary lens to focus an image or scene onto the image sensor. For example, light may enter the imaging system through the primary lens and strike the image sensor. The image sensor may capture and generate image data corresponding to one or more rows in the array of pixel circuits. The image data may comprise image pixel data corresponding to one or more pixel circuits in the array of pixel circuits. For example, image data may comprise information representing a measured voltage, current, or other quantity as a result of light absorbed by each pixel circuit, such that each image pixel comprises an individual pixel intensity value.

The image sensor processes received image data according to any suitable functions such as demosaicing, white balancing, noise reduction, color correction, and the like. The image sensor may further comprise various signal processing circuits and/or systems, such as sample-and-hold circuitry, an analog-to-digital converter, an amplifier, and the like, used to convert the pixel charge to a digital image.

Referring now to FIG. 1, each pixel circuit 100 within an array of pixel circuits is configured to capture a portion of an image or scene. The pixel circuit 100 may be formed of a first chip and a second chip stacked vertically. The pixel circuit 100 comprises a photodetector and a capacitor configured to convert light (photons) into an electric charge consisting of electrons and holes (electron-hole pairs), which may be referred to individually as electron charge and hole charge. The photodetector may comprise any appropriate device responsive to light such as: a photodiode; a photogate; or the like.

A solid-state pixel structure corresponding to a portion of the pixel circuit 100 comprises an epitaxial substrate layer 116 having an upper surface covered with a silicon layer 112 (e.g. a passivation layer) formed of any suitable material such as silicon dioxide ($SiO_2$) or silicon nitride ($Si_3N_4$), to isolate and/or protect the epitaxial substrate layer 116. The pixel circuit 100 may further comprise a color filter 108 and a microlens 110. In an exemplary embodiment, a first side of the color filter 108 is disposed on an opposite of the silicon layer 112 as the epitaxial substrate layer 116. The microlens 110 is disposed adjacent to a second side of the color filter 108 that opposes the silicon layer 112. This arrangement is commonly referred to as a backside illuminated image sensor pixel (BSI). The microlens 110 concentrates impinging photons to the photodetector and generates the electrons and holes, which are simultaneously generated and integrated (collected) in doped regions of the epitaxial substrate layer 116.

Figure 2:
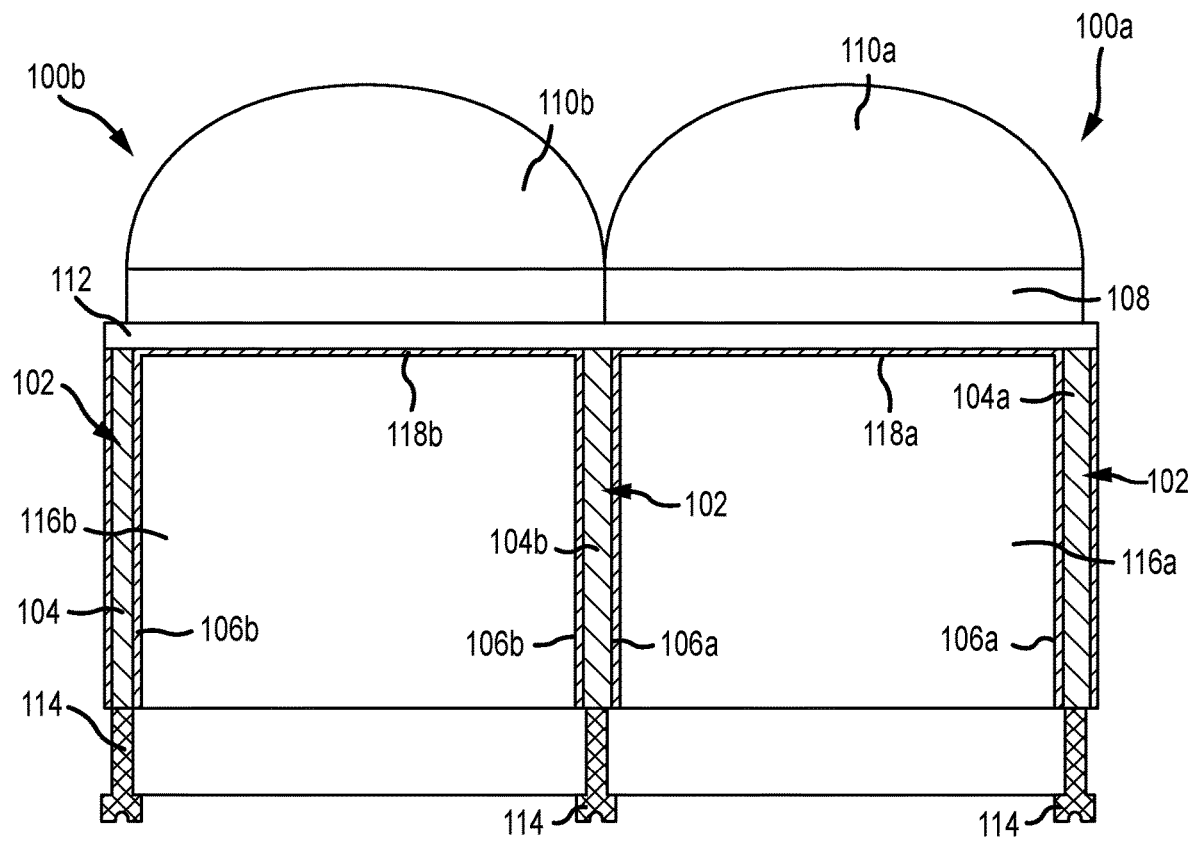
FIG. 2 representatively illustrates a cross-sectional view of a pair of adjacent photodiodes each having a capacitor extending over two sidewalls of the photodiode in accordance with the present technology.
Figure 3:
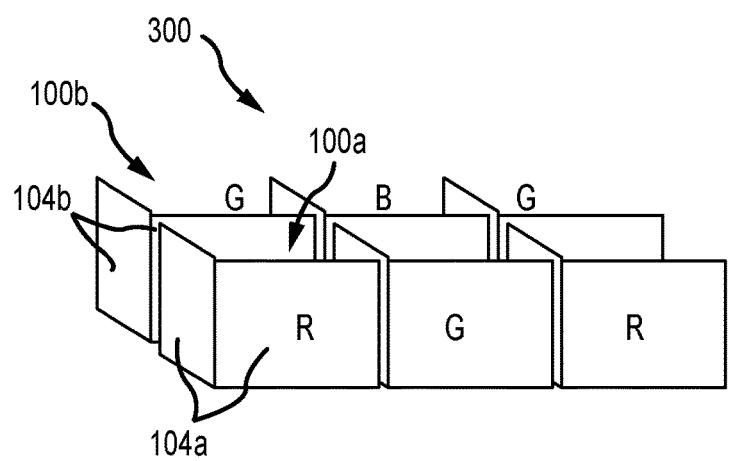
FIG. 3 representatively illustrates a simplified perspective view of an array of photodiodes having a two sided capacitor in accordance with the present technology.

Additional surfaces of the epitaxial substrate layer 116 may be further isolated by a liner comprising a first oxide layer 106 disposed along at least one sidewall and a second oxide layer 118 disposed along the upper surface between the epitaxial substrate layer 116 and the silicon layer 112. More specifically, and referring now to FIGS. 2 and 3, within an array of pixel circuits 300, a first epitaxial substrate layer 116a of a first pixel circuit 100a may be isolated from a second epitaxial substrate layer 116b of a second pixel circuit 100b by a deep trench isolation region 102 that is filled with a conductive material 104 such as: a doped polysilicon; copper; Tungsten; or a transparent electrode such as indium tin oxide (ITO).

The first oxide layer 106a, 106b of the first and second pixel circuits 100a, 100b is disposed along adjacent sidewalls of the epitaxial substrate layer 116 that face the deep trench isolation region 102 to isolate the conductive material 104a, 104b from the first and second epitaxial substrate layers 116a, 116b. The conductive material 104a, 104b forms a capacitor surface that is thereby used to form a capacitor for an adjacent photodector and is connected to the ground bias potential through a via 114.

The vertical orientation of the capacitor allows for a large charge storage capacity and high dynamic range without sacrificing the pixel area exposed to light. This results in smaller sized pixels and higher quantum efficiency providing improved sensor performance and lower cost.

Overall capacitance of a given pixel circuit 100 may be increased by extending the conductive material 104 along an additional sidewall of the epitaxial substrate layer 116. For example, with particular reference to FIG. 3, the first conductive material 104a may form a first and second capacitor surface that extends continuously along two adjacent sidewalls of the first epitaxial substrate layer 116a facing the deep trench isolation region 102. Using two adjacent sidewalls increases the overall surface area that can be used to form the capacitor allowing for a higher capacitance than could be achieved by using a single sidewall in the deep trench isolation region 102. More specifically, the capacitor formed on the first pixel circuit 100a may comprise a first capacitor surface extending along the first oxide layer 106a on a first sidewall of the first epitaxial substrate layer 116a and a second capacitor surface extending along the first oxide layer 106a on a second sidewall of the first epitaxial substrate layer 116a. Similarly, the capacitor formed on the second pixel circuit 100b may be formed along a first and second sidewall of the second epitaxial substrate layer 116b substantially identical to the capacitor formed on the first pixel circuit 100a.

The first oxide layer 106 may comprise any suitable material for isolating the photodetector from the capacitor such as $SiO_2$, however, significant improvements to the scene capture range may be achieved through the use of more advanced high k dielectric (HiK) materials such as: halfnium oxide (HfOx); zirconium oxide (ZrOx), zirconium aluminate (ZrAlOx), tantalum pentoxide ($Ta_2O_5$); and aluminum oxide ($Al_2O_3$). Similarly, the thickness of the first oxide layer 106 may have an impact on the level of improvement to the dynamic range. The use of HiK materials may generally improve the dynamic range but the level of improvement may be, at least partially, dependent on the thickness of the HiK layer. In the present example, the thickness of the HiK layer and the level of dB improvement to the dynamic range may be inversely proportional such that as the thickness of the HiK layer increases the dB improvement to the dynamic range may decrease. For example, in one embodiment, the first oxide layer 106 may extend along two adjacent sidewalls as described above and comprise a thickness of approximately 50 nanometers and provide an overall improvement to the dynamic range of about 14 dB compared to a similar structure using non-HiK oxide materials. The dB improvement may increase in a non-linear manner as the thickness of the HiK layer is reduced. Conversely, dB improvement over a baseline figure may decrease as the thickness of the HiK layer is increased.

Figure 4:
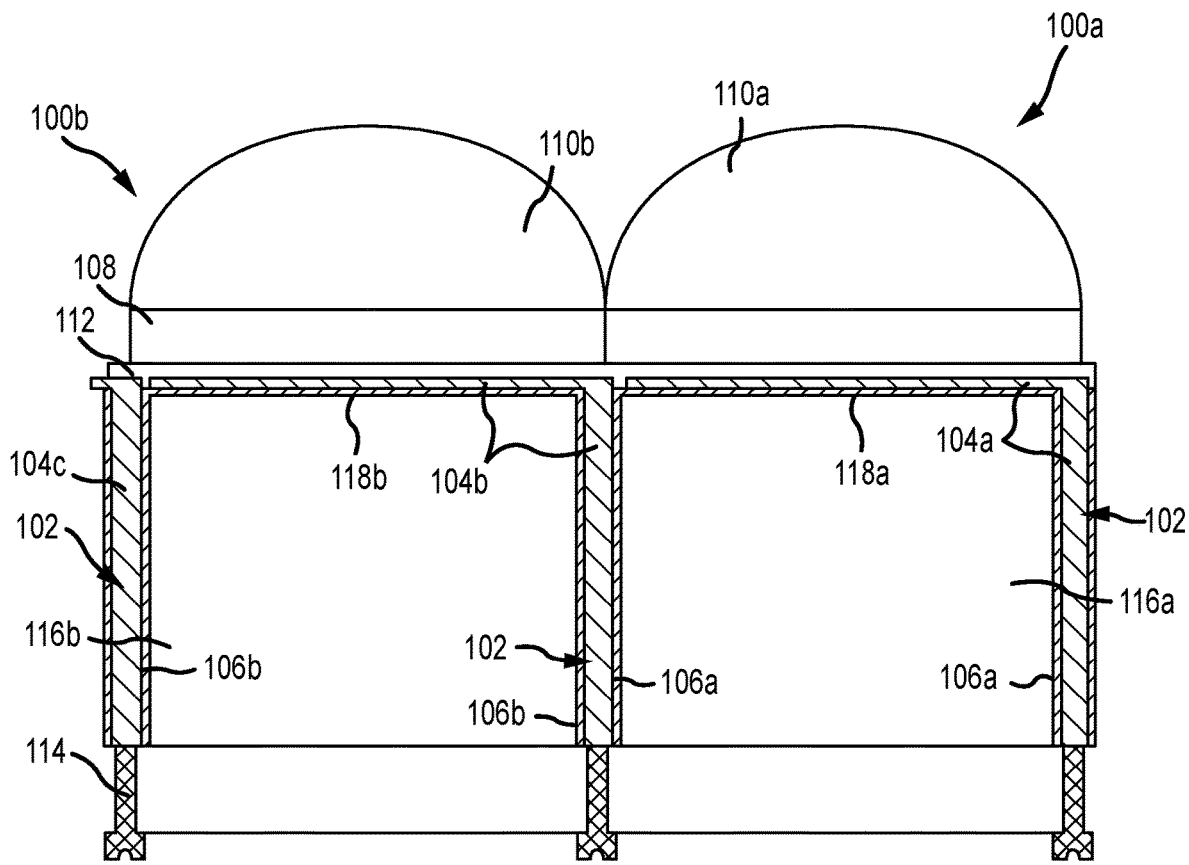
FIG. 4 representatively illustrates a cross-sectional view of a pair of photodiodes each having a capacitor extending over two sidewalls and an upper surface of the photodiode in accordance the present technology.
Figure 5:
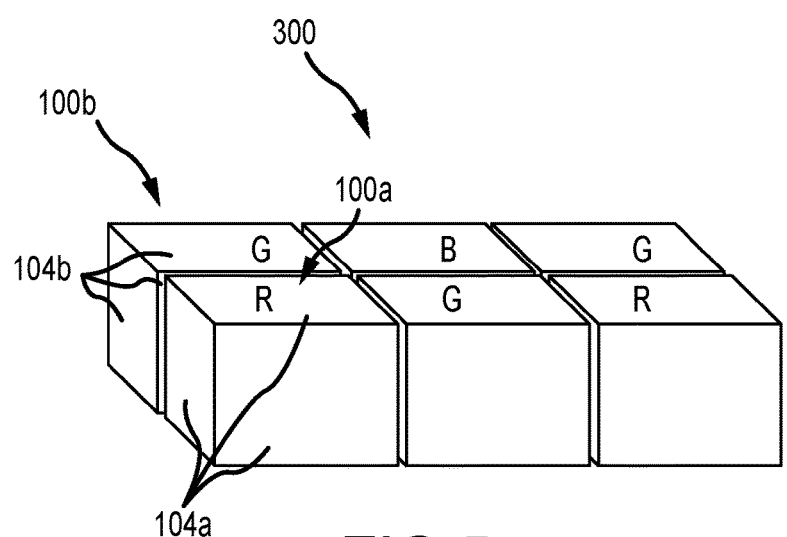
FIG. 5 representatively illustrates a simplified perspective view of an array of photodiodes having a capacitor extending over two sidewalls and an upper surface of the photodiode in accordance with the present technology.

In an alternative embodiment, and referring now to FIGS. 4 and 5, the overall capacitance of a given pixel circuit 100 may be increased even further by extending the conductive material 104 along not only a second sidewall of the epitaxial substrate layer 116 but also along the upper surface of the epitaxial substrate layer 116 itself. This creates additional surface area over which to form the capacitor allowing for increased capacitance. For example, a first conductive material 104a may extend along two adjacent sidewalls of the first epitaxial substrate layer 116a facing the deep trench isolation region 102 and may also be extended along the upper surface of the first epitaxial substrate layer 116a between the second oxide layer 118a and the silicon layer 112. Similarly, a second conductive material 104b may extend along two adjacent sidewalls of the second epitaxial substrate layer 116b facing the deep trench isolation region 102 and may also be extended along the upper surface of the second epitaxial substrate layer 116b between the second oxide layer 118b and the silicon layer 112. This structure may be repeated for every pixel circuit 100 in the array 300.

Extending the conductive material 104 to the upper surface requires the use of a transparent electrode to prevent photons passing through the microlens 110 and color filter 108 from being blocked from entering the photodetector portion of the pixel circuit 100. For example, in one embodiment, the first and second conductive materials 104a, 104b may formed from a single layer of ITO that is etched to isolate individual pixel circuits 100 from each other.

As described above, using HiK materials may provide increased advantages relating to overall dynamic range improvement. For example, in addition to extending the capacitor to the upper surface of the pixel circuit 100, using HiK materials for both the first and second oxide layers 106, 118 may provide a dB improvement of between 10 dB and 18 dB as compared to the same structural formation using other oxide materials.

Figure 6:
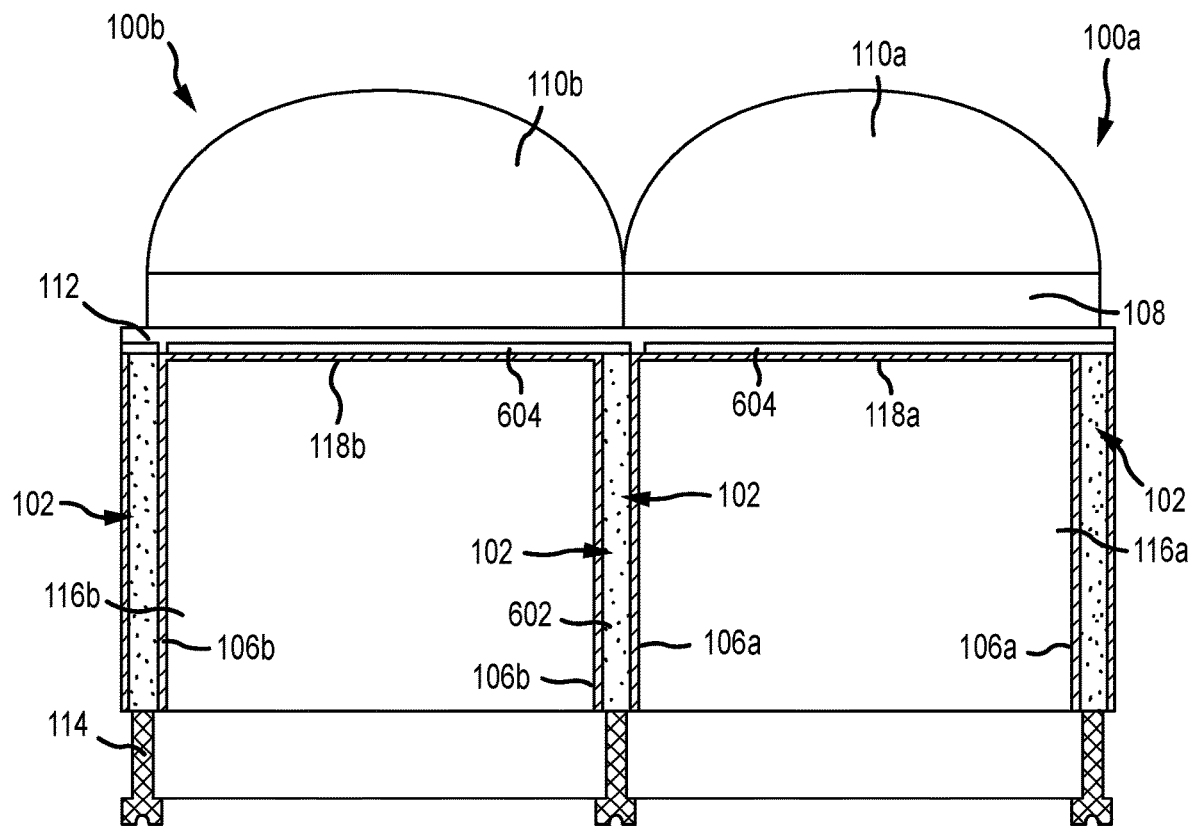
FIG. 6 representatively illustrates a cross-sectional view of a pair of adjacent photodiodes each having a capacitor extending over one wall and the upper surface of the photodiode in accordance the present technology.

In an alternative embodiment, and referring now to FIG. 6, capacitance of a given pixel circuit 100 may also be increased by using two different conductive materials 602, 604 to form the capacitor. For example, the capacitor may be formed by filling with deep trench isolation region 102 with a first conductive material 602 and forming an upper surface from a second conductive material 604. Because the second conductive material 604 is positioned on the upper surface of the epitaxial substrate layer 116, use of a transparent electrode such as ITO is required. Since the first conductive material 602 isn't subjected to photons in the same manner as the second conductive layer 604, other materials such as copper or tungsten may be used. As described above, using HiK materials to form the first and second oxide layers 106, 118 may also provide increases to the overall dynamic range capability of the pixel circuits 100a, 100b.

Figure 7:
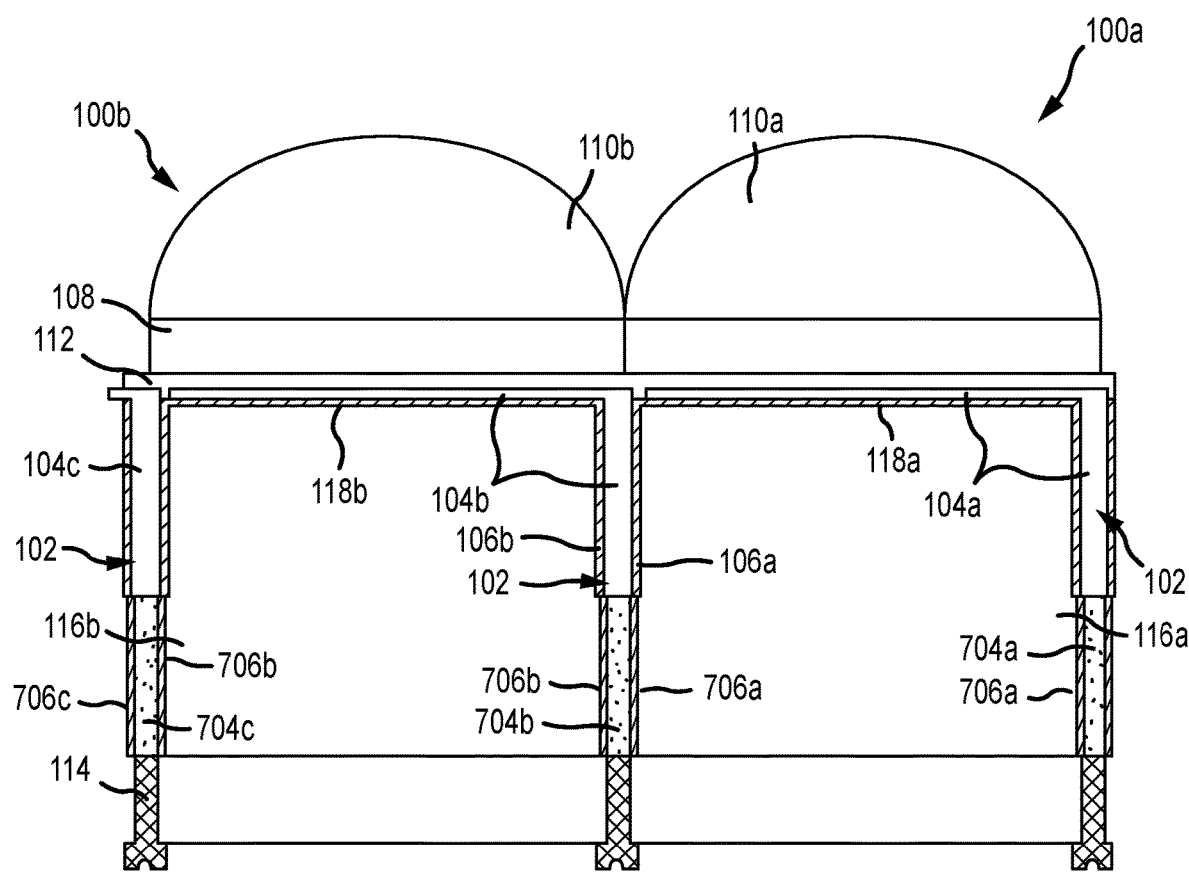
FIG. 7 representatively illustrates a cross-sectional view of an alternative pair of photodiodes each having a capacitor extending over two sidewalls and an upper surface of the photodiode in accordance the present technology.

In yet another alternative embodiment, the conductive material disposed within the deep trench isolation region 102 may comprise more than one material. For example, and referring now to FIG. 7, the deep trench isolation region 102 may be formed as a partial deep trench from the frontside and a subsequent partial deep trench from the backside which will connect to the partial deep trench from the frontside. The portion of deep trench isolation region 102 formed from the backside may comprise a first conductive material 104a, 104b extending along a first portion of the sidewall and the portion of deep trench isolation region 102 formed from the front side may comprise a second conductive material 704a, 704b extending along a frontside oxide layer 706a, 706b that is disposed along a second portion of the sidewall below the first oxide layer 106a, 106b. The first conductive material 104a, 104b may comprise metal suck as ITO or tungsten and the second conductive material 704a, 704b may comprise a different metal based conductor as that of the first conductive material 104a, 104b such as polysilicon, tungsten, or copper. As described above for the first conductive material 104, the second conductive material 704 may form a third capacitor surface for the capacitor. The frontside oxide layer 706a, 706b may comprise any suitable material such as SiO₂.

Figure 8:
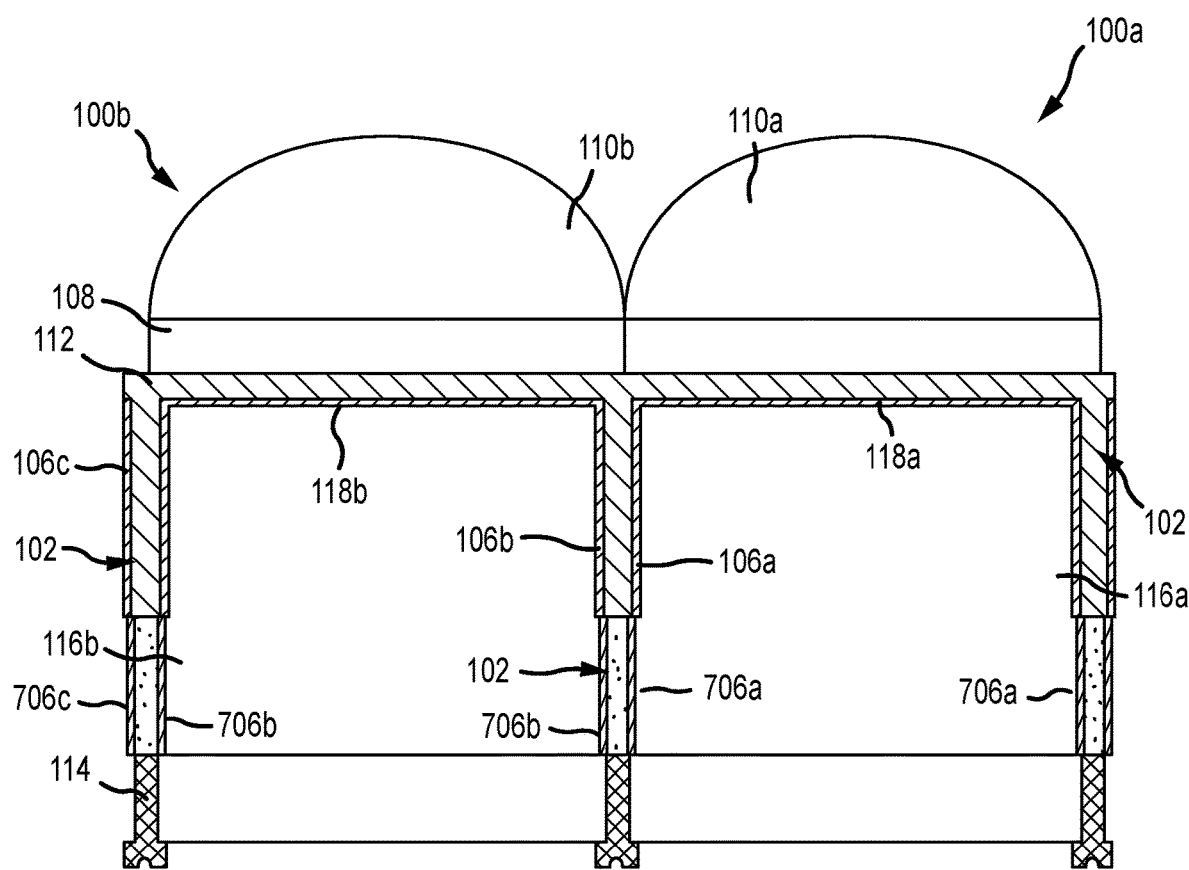
FIG. 8 representatively illustrates a cross-sectional view of an alternative pair of photodiodes each having a capacitor extending over two sidewalls and an upper surface of the photodiode in accordance the present technology.

Another alternative, and referring now to FIG. 8 is that a partial front side portion of the deep trench isolation region 102 acts only as a trench isolation for holes and is filled with SiO₂. The SiO₂ may also extend completely over the second oxide layer 118a, 118b and act as the silicon layer 112.

Figure 9A:
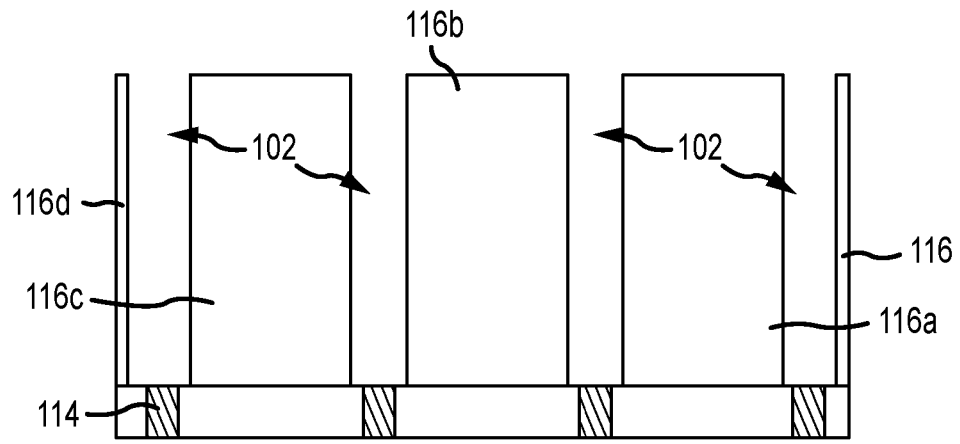
FIGS. 9A-9G illustrate a simplified formation process for a pixel circuit of an image sensor in accordance with the present technology.
Figure 9B:
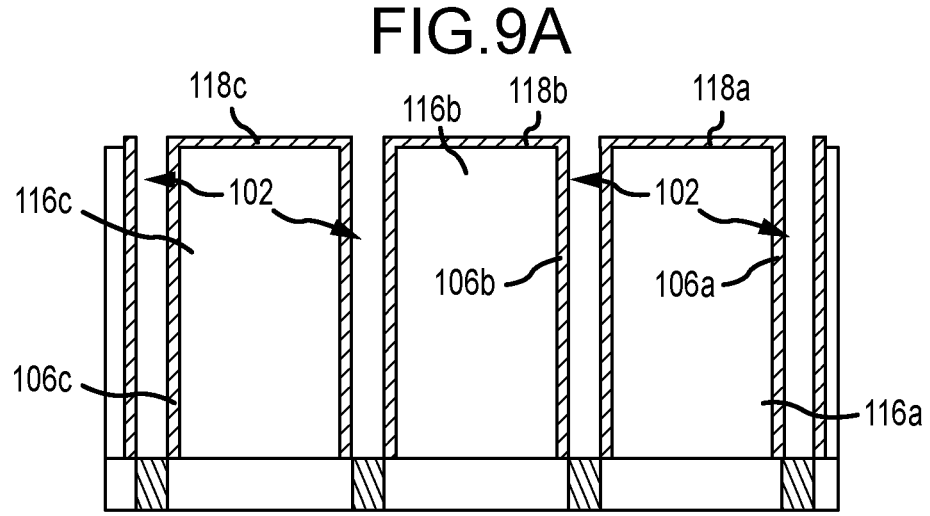

According to various embodiments of the technology and referring to now FIGS. 9A-9G, a pixel circuit 100 may be formed by initially etching a deep trench isolation region 102 to separate the epitaxial substrate layer 116 of individual pixel circuits 100 from each other (FIG. 9A). For a BSI wafer the deep trench etch will stop on the shallow trench isolation oxide (STI) or any insulating layer (e.g. inter level dielectric like SiO2) that make up the front side circuit. The sidewalls of the epitaxial substrate layers 116a, 116b, 116c, 116d facing the deep trench isolation region 102 and the upper surface of each epitaxial substrate layer 116 may then be lined with an oxide layer 106, 118 to isolate the individual epitaxial substrate layers 116 (FIG. 9B). For example, the oxide layer lining the sidewalls and the upper surface of the epitaxial substrate layer 116 may comprise a HiK material such as hafnium oxide having a thickness of between about 15 and 70 nanometers.

Figure 9C:
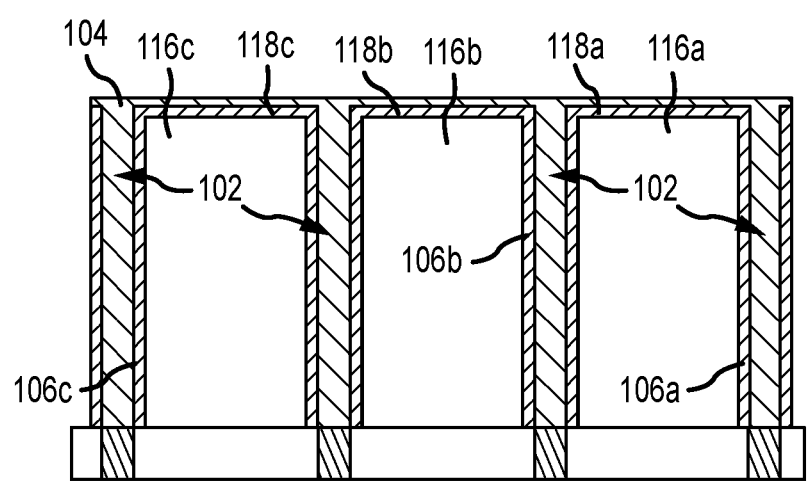
Figure 9D:
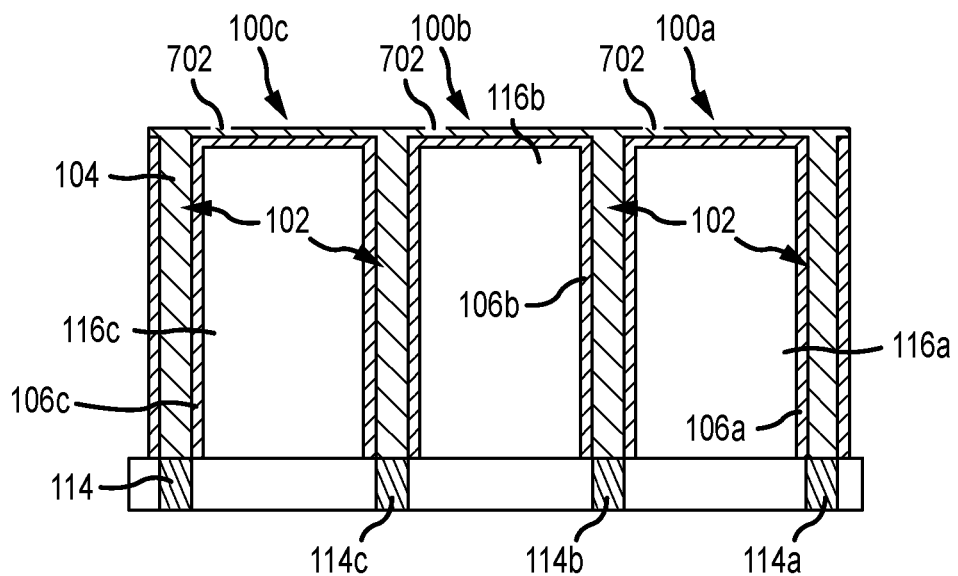

The deep trench isolation region 102 may then be filled with a conductive material 104, such as a transparent electrode so that the top surface of the oxide layer 118 is also covered by the conductive material 104 (FIG. 9C). A top surface of the conductive material 104 may then be etched in a desired pattern 702 to isolate portions of the conductive material 104 to a particular epitaxial substrate layer 116 (FIG. 9D). For example, the conductive material may be etched in manner such that a first epitaxial substrate layer 116a is essentially surrounded by the conductive material 104. Similarly, a second and third epitaxial substrate layer 116b, 116c may be isolated by other portions of the conductive material 104. Each individual portion/section of the conductive material 104 may be coupled to a via 114a, 114b, 114c to create a capacitor on each individual pixel circuit 100a, 100b, 100c.

Figure 9E:
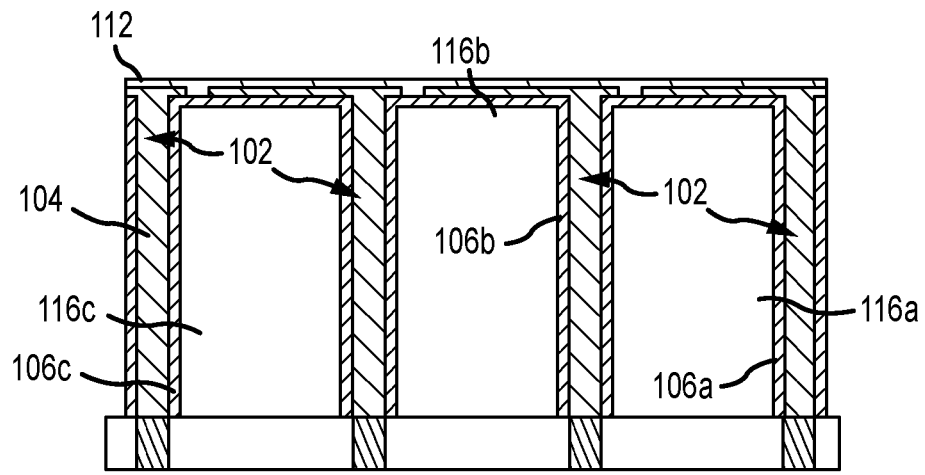
Figure 9F:
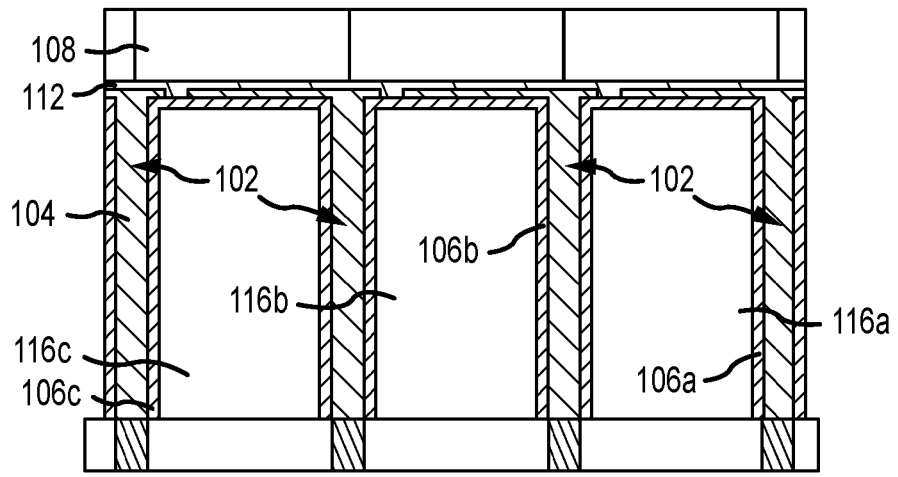
Figure 9G:
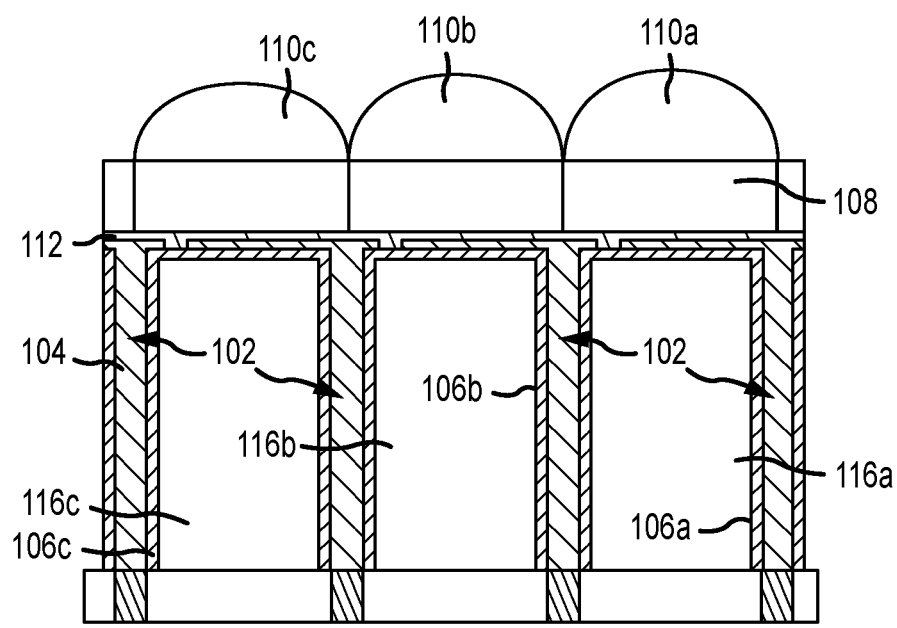

A passivation layer may then be formed over the top of the conductive material 104. More specifically, an silicon layer 112 comprising a material such as SiO₂ may be formed over the conductive material to complete a backside illumination structure on the wafer (FIG. 9E). A color filter 108 may then be formed over the silicon layer 112 (FIG. 9F) before a micro lens 110a, 110b, 110c is positioned above each epitaxial substrate layer 116a, 116b, 116c (FIG. 9G) completing formation of the image sensor.

In the foregoing, the deep trench etch is from the BSI side of the wafer. However, the deep trench isolation region 102 may be formed from the FSI side of the wafer. In this case Polysilicon can be used as the conductive material 104 inside the deep trench isolation region 102. The trench etch may be timed and stop at a certain depth. Alternatively silicon on insulator (SOI) wafer may be used which would provide a SiO₂ etch stop for the deep trench etch.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment wherein the described pixels are formed in the p-type doped semiconductor epitaxial layer with the n+type doped FD wherein the pinned photodiode collects electrons and the hole signal is sensed on a capacitor connected to two sidewalls and/or the upper surface of the epitaxial substrate layer. The capacitance of the pixel circuit may be increased or decreased by controlling the amount surface area along the sidewalls or upper surface that is used to form the capacitor.

However, changes and modifications may be made to the exemplary embodiment without departing from the scope of the present technology. These and other changes or modifications are intended to be included within the scope of the present technology, as expressed in the following claims.

The invention claimed is:

1. A pixel circuit for a solid-state high dynamic range image sensor, comprising:
   a micro lens;
   a color filter disposed immediately adjacent the micro lens;
   an epitaxial substrate layer disposed adjacent the color filter opposite the micro lens;
   a first oxide layer disposed along a first sidewall of the epitaxial substrate layer facing a deep trench isolation region;
   a second oxide layer disposed along an upper surface of the epitaxial substrate layer;
   a silicon layer disposed between the second oxide layer and the color filter; and
   a capacitor, comprising:
      a first capacitor surface extending along the first oxide layer of the epitaxial substrate layer facing the deep trench isolation region; and
      a second capacitor surface extending along at least one of:
         the first oxide layer disposed along a second sidewall of the epitaxial substrate layer facing the deep trench isolation region; and
         an upper surface of the second oxide layer below the silicon layer.

2. A pixel circuit according to claim 1, wherein the second capacitor surface extends along both of the second sidewall of the epitaxial substrate layer and the upper surface of the second oxide layer.

3. A pixel circuit according to claim 1, further comprising:
   a frontside oxide layer disposed along a lower portion of the first sidewall below the first oxide layer; and
   a third capacitor surface disposed along the frontside oxide layer.

4. A pixel circuit according to claim 1, wherein:
   the first and second oxide layers each comprise a high k material; and
   the capacitor comprises a transparent electrode.

5. A pixel circuit according to claim 4, wherein the high k material comprises hafnium oxide.

6. A pixel circuit according to claim 4, wherein the transparent electrode comprises indium tin oxide.

7. A pixel circuit according to claim 1, wherein the second capacitor surface extending along the second oxide layer comprises a transparent electrode.

8. A pixel circuit according to claim 7, wherein the transparent electrode comprises indium tin oxide.

9. A solid-state high dynamic range image sensor, comprising:
   an array of pixel circuits isolated from each other by a deep trench isolation region,
   wherein each pixel circuit in the array comprises:
      a micro lens;
      a color filter disposed immediately adjacent the micro lens;
      an epitaxial substrate layer disposed adjacent the color filter opposite the micro lens;
      a first oxide layer disposed along a first sidewall and a second sidewall of the epitaxial substrate layer facing a deep trench isolation region;
      a high k dielectric layer disposed along the upper surface of the epitaxial substrate layer;
      a silicon layer disposed between the high k dielectric layer and the color filter; and
      a capacitor, comprising:
         a first capacitor surface extending along the first oxide layer on the first sidewall; and
         a second capacitor surface extending along the first oxide layer on the second sidewall.

10. A solid-state high dynamic range image sensor according to claim 9, wherein the capacitor further comprises a third capacitor surface extending along the upper surface of the epitaxial substrate layer between the high k dielectric layer and the silicon layer.

11. A solid-state high dynamic range image sensor according to claim 10, wherein the third capacitor surface comprises a transparent electrode.

12. A solid-state high dynamic range image sensor according to claim 11, wherein the transparent electrode comprises indium tin oxide.

13. A solid-state high dynamic range image sensor according to claim 9, wherein:
the first oxide layer comprises a high k material; and
the capacitor comprises a transparent electrode.

14. A solid-state high dynamic range image sensor according to claim 13, wherein the high k material and the high k dielectric layer each comprise hafnium oxide.

15. A solid-state high dynamic range image sensor according to claim 13, wherein the transparent electrode comprises indium tin oxide.

16. A method of forming a capacitor for a solid-state high dynamic range image sensor, comprising:
forming a first capacitor surface extending along a first oxide layer disposed along a first sidewall of an epitaxial substrate layer facing a deep trench isolation region separating a first pixel circuit from a second pixel circuit; and
forming second capacitor surface extending along at least one of:
the first oxide layer disposed along a second sidewall of the epitaxial substrate layer facing the deep trench isolation region separating the first pixel circuit from a third pixel circuit; and
an upper surface of a high k dielectric layer disposed along an upper surface of the epitaxial substrate layer.

17. A method of forming a capacitor according to claim 16, wherein the second capacitor surface extends along both of the second sidewall of the epitaxial substrate layer and the upper surface of the high k dielectric layer.

18. A method of forming a capacitor according to claim 16,
the first and second oxide layers each comprise a high k material; and
the capacitor comprises a transparent electrode.

19. A method of forming a capacitor according to claim 18, wherein the transparent electrode comprises indium tin oxide.

20. A method of forming a capacitor according to claim 16, further comprising:
forming a silicon layer disposed between the high k dielectric layer and a color filter; and
forming a micro lens along an upper surface of the color filter.

* * * * *